US006613590B2

(12) United States Patent
Simmons

(10) Patent No.: US 6,613,590 B2
(45) Date of Patent: *Sep. 2, 2003

(54) YIELD BASED, IN-LINE DEFECT SAMPLING METHOD

(75) Inventor: Steven J. Simmons, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/847,708

(22) Filed: May 2, 2001

(65) Prior Publication Data

US 2001/0023083 A1 Sep. 20, 2001

Related U.S. Application Data

(63) Continuation of application No. 09/138,295, filed on Aug. 21, 1998, now Pat. No. 6,265,232.

(51) Int. Cl.[7] .............................................. H01L 21/00
(52) U.S. Cl. ............................ 438/14; 438/14; 438/4; 438/7
(58) Field of Search ......................... 438/14–18, 701, 438/4, 7

(56) References Cited

U.S. PATENT DOCUMENTS

| | | | |
|---|---|---|---|
| 4,376,583 A | 3/1983 | Alford et al. | |
| 5,103,166 A | 4/1992 | Jeon et al. | |
| 5,127,726 A | 7/1992 | Moran | |
| 5,240,866 A | 8/1993 | Friedman et al. | |
| 5,294,812 A | 3/1994 | Hashimoto et al. | |
| 5,301,143 A | 4/1994 | Ohri et al. | |
| 5,539,752 A | 7/1996 | Berezin et al. | |
| 5,544,256 A | 8/1996 | Brecher et al. | |
| 5,777,901 A | 7/1998 | Berezin et al. | |
| 6,265,232 B1 | * 7/2001 | Simmons | 438/14 |
| 6,479,305 B2 | * 11/2002 | Kono et al. | 438/14 |
| 6,485,991 B1 | * 11/2002 | Jitramas et al. | 438/14 |
| 6,492,189 B1 | * 12/2002 | Yamaguchi | 438/18 |

OTHER PUBLICATIONS

S.L. Riley, "Optical Inspection of Wafers Using Large–Area Defect Detection and Sampling", The IEEE International Workshop on Defect and Fault Tolerance in VLSI Systems, Nov. 4–6, 1992, pp. 12–21.

KLA 255X Software V3.6 Option Release Notes, "Automatic Clustering and Sampling of Defects", 19 pages, (No Date).

* cited by examiner

Primary Examiner—Michael S. Lebentritt
(74) Attorney, Agent, or Firm—TraskBritt

(57) ABSTRACT

A test method provides a sample of wafer level defects most likely to cause yield loss on a semiconductor wafer subdivided into a plurality of integrated circuits (IC's). Defect size and location data from an inspection tool is manipulated in an algorithm based on defect sizes and geometry parameters. The defects are classified by defect size to form size based populations. The contribution of each size range of defect population to yield loss is calculated and random samples for review are selected from each defect size population. The number of samples from each size defect population is proportional to the predicted yield impact of each sample. The method is rapid and permits on-line process modification to reduce yield losses.

29 Claims, 5 Drawing Sheets

Lot No.
Wager No.
Date
Inspection Level

| Bin No. | Defect Size | # Defects | % of Total | WYL | D | P | S |
|---|---|---|---|---|---|---|---|
| 1 | 0.0-0.5 μm | 7 | 2.9 | 39.4 | 0.005 | 0.005 | 0 |
| 2 | 0.5-1.0 μm | 111 | 46.6 | 34.0 | 0.141 | 0.153 | 2 |
| 3 | 1.0-2.0 μm | 81 | 34.0 | 31.7 | 0.199 | 0.216 | 3 |
| 4 | 2.0-4.0 μm | 2 | 0.8 | 38.6 | 0.025 | 0.027 | 0 |
| 5 | 4.0-8.0 μm | 26 | 10.9 | 23.6 | 0.404 | 0.439 | 5 |
| 6 | > 8.0 μm | 11 | 4.6 | 33.8 | 0.146 | 0.159 | 2 |
| Total | | 238 | 100.0 | 39.6 | 0.920 | 1.000 | 12 |

Fig. 3

DEFECT REVIEW SHEET

PART TYPE:             DATE:              # DEFECTS SAMPLED:
LOT NO:                                   OPERATOR:
WAFER ID:                                 TIME IN:
STEP ID:                                  TIME OUT:
TOOL ID:
PROJECT NO:

PREDICTED WAFER YIELD LOSS WYL + 39.6
TOTAL DEFECT COUNT = 238

| BIN # | 1 | | 2 | | 3 | | 4 | | 5 | | 6 | |
|---|---|---|---|---|---|---|---|---|---|---|---|---|
| SIZE | 0.0-0.5 | | 0.5-1.0 | | 1.0-2.0 | | 2.0-4.0 | | 4.0-8.0 | | > 8.0 | |
| WYL | 39.4 | | 34.0 | | 31.7 | | 38.6 | | 23.6 | | 33.8 | |
| # DEFECTS | 7 | | 111 | | 81 | | 2 | | 26 | | 11 | |
| | ID | P | ID | P | ID | P | ID | P | ID | P | ID | P |
| | | | 183 | 2 ✓ | 64 | 2 ✓ | | | 13 | 1 ✓ | 162 | 1 ✓ |
| | | | 213 | 2 ✓ | 205 | 2 ✓ | | | 83 | 1 ✓ | 192 | 1 ✓ |
| | | | | | 226 | 2 ✓ | | | 194 | 1 ✓ | | |
| | | | | | | | | | 206 | 2 ✓ | | |
| | | | | | | | | | 225 | 2 ✓ | | |

| EXTRA SAMPLES | | |
|---|---|---|
| DIE | DEFECT ID | DESCRIPTION |
| | | |
| | | |
| | | |
| | | |

| DEFECT TYPE | DESCRIPTION | TOTAL |
|---|---|---|
| 1 | Block etch | 5 |
| 2 | Lower Level Contamination | 7 |
| 3 | | |
| 4 | | |
| 5 | | |
| 6 | CANNOT FIND | |

*Fig. 4*

YIELD BASED, IN-LINE DEFECT SAMPLING METHOD

CROSS-REFERENCE TO RELATED APPLICATION

This application is a continuation of application Ser. No. 09/138,295, filed Aug. 21, 1998, now U.S. Pat. No. 6,265,232 B1, issued Jul. 24, 2001.

BACKGROUND OF THE INVENTION

1. Field of the Invention

This invention relates generally to integrated circuit semiconductor device manufacturing. More particularly, the instant invention pertains to methods for integrated circuit defect detection, classification, and review in the wafer stage of the integrated circuit semiconductor device manufacturing process.

2. State of the Art

Integrated circuit semiconductor devices (IC's) are small electronic circuits formed on the surface of a wafer of semiconductor material such as silicon. The IC's are fabricated in plurality in wafer form and tested by a probe to determine electronic characteristics applicable to the intended use of the IC's. The wafer is then subdivided into discrete IC chips or dice, and then further tested and assembled for customer use through various well-known individual die IC testing and packaging techniques, including lead frame packaging, Chip-On-Board (COB) packaging, and flip-chip packaging (FCP). Depending upon the die and wafer sizes, each wafer is divided into a few dice or as many as several hundred or more than one thousand discrete dice.

Tests may be conducted at various stages in the manufacturing process

The tests generally conducted on packaged IC's are known as pre-grade, burn-in, and final tests, which test IC's for defects and functionality, and grade each IC for speed. Where the probability that a wafer or a wafer lot will yield acceptable IC's is high, tests are typically omitted for most of the IC's and reliance for at least some tests is placed on testing of a relatively small sample of IC's.

The yield in manufacture of IC's is normally limited by defects. Defects may be inherent in the semiconductor material from which a number of wafers are sliced, or may result from any of the manufacturing steps including initial wafer slicing. Defects are generally classified as either "lethal" defects, which will disable an IC, or "benign" defects. Benign defects may have various degrees of benignancy. For example, some defects may be tolerated for certain less demanding use of the IC, or the IC or wafer may be reworked relatively easily for satisfactory operability in other applications.

When any of the wafers in a wafer lot appear to be unreliable because of fabrication or process errors, all of the wafers in the lot typically undergo enhanced reliability testing. A wafer lot may comprise 50 or more wafers, many of which are probably not deemed to be unreliable. Thus, in requiring testing of all wafers, a large waste in test time, labor and expense is incurred.

In addition, IC's which may be initially rejected based on a particular test criterion may be later retested to meet different specifications. Again, test facilities and personnel time are diverted from testing untested IC's to do retesting.

A substantial part of the cost in producing integrated circuits is incurred in testing the devices. Thus, it is important to identify potentially defective IC's as early as possible in the manufacturing process to not only reduce intermediate and final testing costs, but to avoid the other manufacturing expenses in the production of failing IC's. Identification of wafer defects prior to subsequent IC manufacturing steps and extensive testing steps is beneficial in deciding whether the wafer or other wafers in the lot should be used, reworked, or discarded. In addition, under the current test protocol, the initial elimination of potentially defective IC's from the manufacturing process will avoid the necessity of testing large numbers of IC's from other wafers in the same wafer lot.

As described in U.S. Pat. No. 5,301,143 of Ohri et al., U.S. Pat. No. 5,294,812 of Hashimoto et al., and U.S. Pat. No. 5,103,166 of Jeon et al., some methods have been devised to electronically identify individual IC's. Such methods take place "off" the manufacturing line and involve the use of electrically retrievable identification (ID) codes, such as so-called "fuse-ID's" which are programmed into individual IC's for identification. The programming of a fuse-ID typically involves selectively blowing an arrangement of fuses and anti-fuses in an IC so that when accessed, an ID code for the particular IC is outputted. Unfortunately, none of these methods addresses the problems of identifying those IC's on a manufacturing line which will probably fail during subsequent testing and processing, and identifying wafers which will probably have an unacceptable failure rate, i.e., yield loss.

Various apparatus have been devised for locating, identifying, and microscopically examining surface defects on semiconductor wafers, LCD's and the like. Such equipment is disclosed, for example, in U.S. Pat. No. 5,127,726 of Moran, U.S. Pat. No. 5,544,256 of Brecher et al., and U.S. Pat. No. 4,376,583 of Alford et al.

Commercially available wafer scanning tools are made by KLA Instruments Corporation of Santa Clara, Calif., Tencor Instruments Corporation of Mountain View, Calif., Inspex, Inc. of Billerica, Mass., and other companies.

In an attempt to determine when a defect or defects may be lethal or killing to the purpose of an IC, defects have been classified by size, e.g. "large area defects" and "point defects", and by the number of defects in a statistically generated "cluster" of defects. In addition, defects may be further classified by type or cause, e.g. incomplete etch, stacking faults, slip, dislocations, particle contamination, pinholes (intrusions), bridges (protrusions), etc.

U.S. Pat. No. 5,539,752 of Berezin et al. discloses a method for automated defect analysis of semiconductor wafers, using available wafer scanning tools. Defects from different sub-populations are initially preclassified by type, so that subsequent counts of each type on wafers will provide numbers of each type to provide warnings regarding particular manufacturing steps.

In U.S. Pat. No. 5,240,866 of Friedman et al., a method for characterizing circuit defects in a wafer is based on detecting clustering of defects to find a common cause.

Automatic defect detection and sampling is discussed in S. L. Riley, Optical Inspection of Wafers Using Large-Area Defect Detection and Sampling, IEEE Computer Society Press, 1992, pp 12–21. The proposed algorithm relies on the detection of clustered chips and selects defects for sampling on the basis of clustering, without considering defect size or the predicted effect on yield.

BRIEF SUMMARY OF THE INVENTION

The present invention is directed to a method for identifying integrated circuit defects at the wafer stage and classifying the identified defects in accordance with the predicted potential for causing losses in yield, whereby measures may be taken in-line to correct or ameliorate the losses, a method for identifying wafer defects having the greatest predicted effect on yield loss, whereby in-line corrective measures are directed at the defects which affect wafer yield to the greatest degree, and such methods which may be carried out with the use of a computer.

The invention relates to the identification of semiconductor wafers having the greatest predictive yield loss so that the reasons for such yield loss may be addressed in-line. The method of processing includes surface inspection to determine defects on the wafer wherein defects are classified in a computer generated file by numbers, locations, ranges of sizes, defect types and the particular die or dice affected thereby.

In an algorithm of the invention, a die yield loss value DYL is calculated for each die of the wafer; the DYL values are summed to obtain a wafer yield loss value WYL. The effect of each size range of defect upon wafer yield loss WYL may then be calculated.

Defects may then be randomly selected from each defect size range for engineering review, whereby in-line changes may be made to the production process to reduce the numbers or effects of defects most affecting the wafer yield.

Thus, the method permits the defects having the greatest yield limiting effects to be addressed, without undue effort wasted on defects having lesser effects or no effects on yield.

BRIEF DESCRIPTION OF THE DRAWINGS

FIG. 3 is an example of a tabular collation of computer-generated intermediate defect calculation values resulting from a method of the invention; and FIG. 4 is an example of a log sheet indicating the selection of sampled defects and an evaluation thereof in accordance with the method of the invention.

DESCRIPTION OF THE ILLUSTRATED EMBODIMENTS

The invention comprises an improved method for the testing of integrated circuit semiconductor devices in the wafer stage. Inspection tools identify each identifiable wafer defect 14 by location and size. The method strategically selects a sample of defects 14 which have characteristics preselected to have the greatest negative impact on wafer yield. The method employs an algorithm which incorporates the defect size distribution, the defect spatial distribution, and a yield metric.

Figure 1:
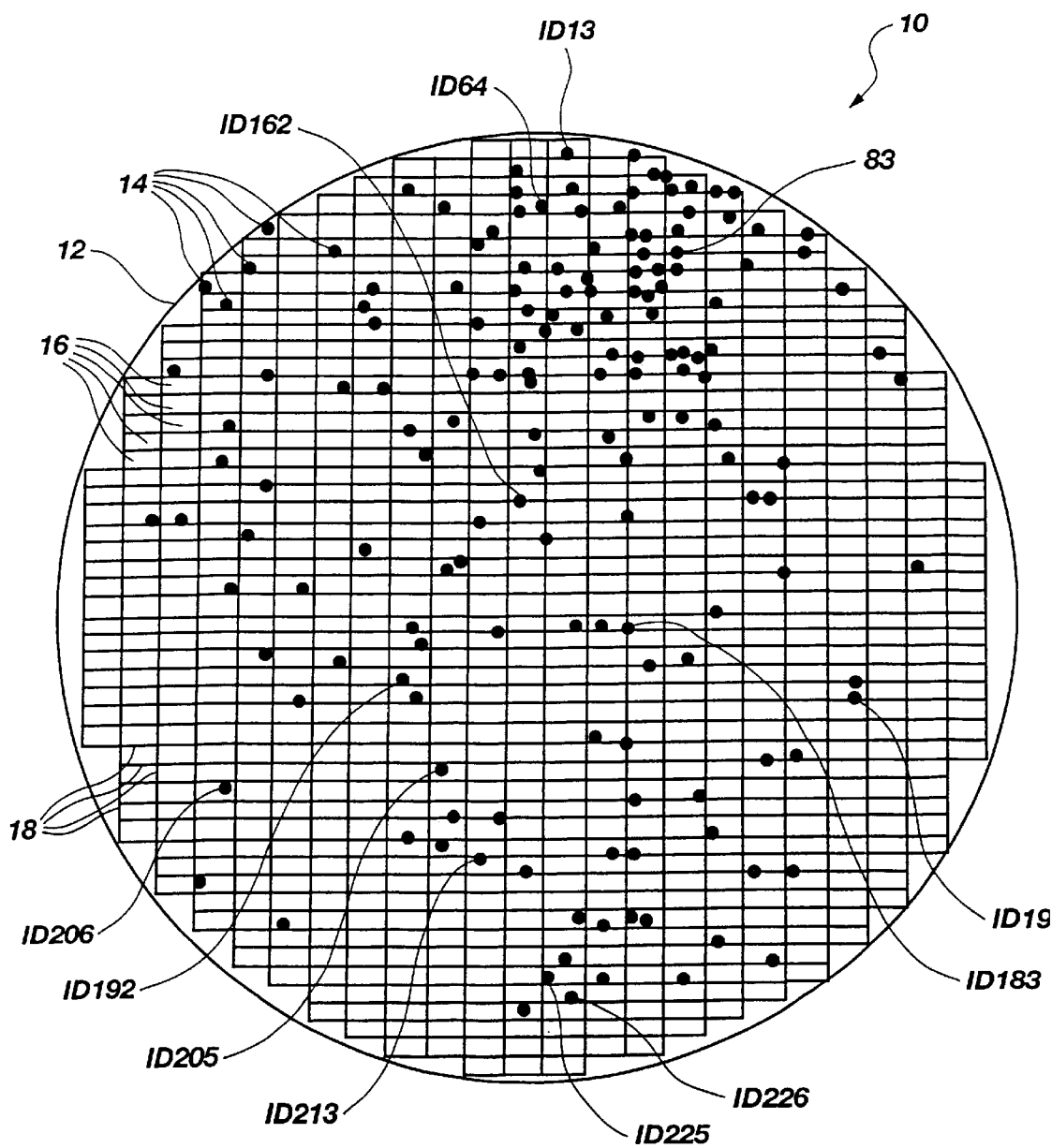
FIG. 1 is a plan view of an exemplary prior art wafer defect map generated by a surface inspection tool.
Figure 2A:
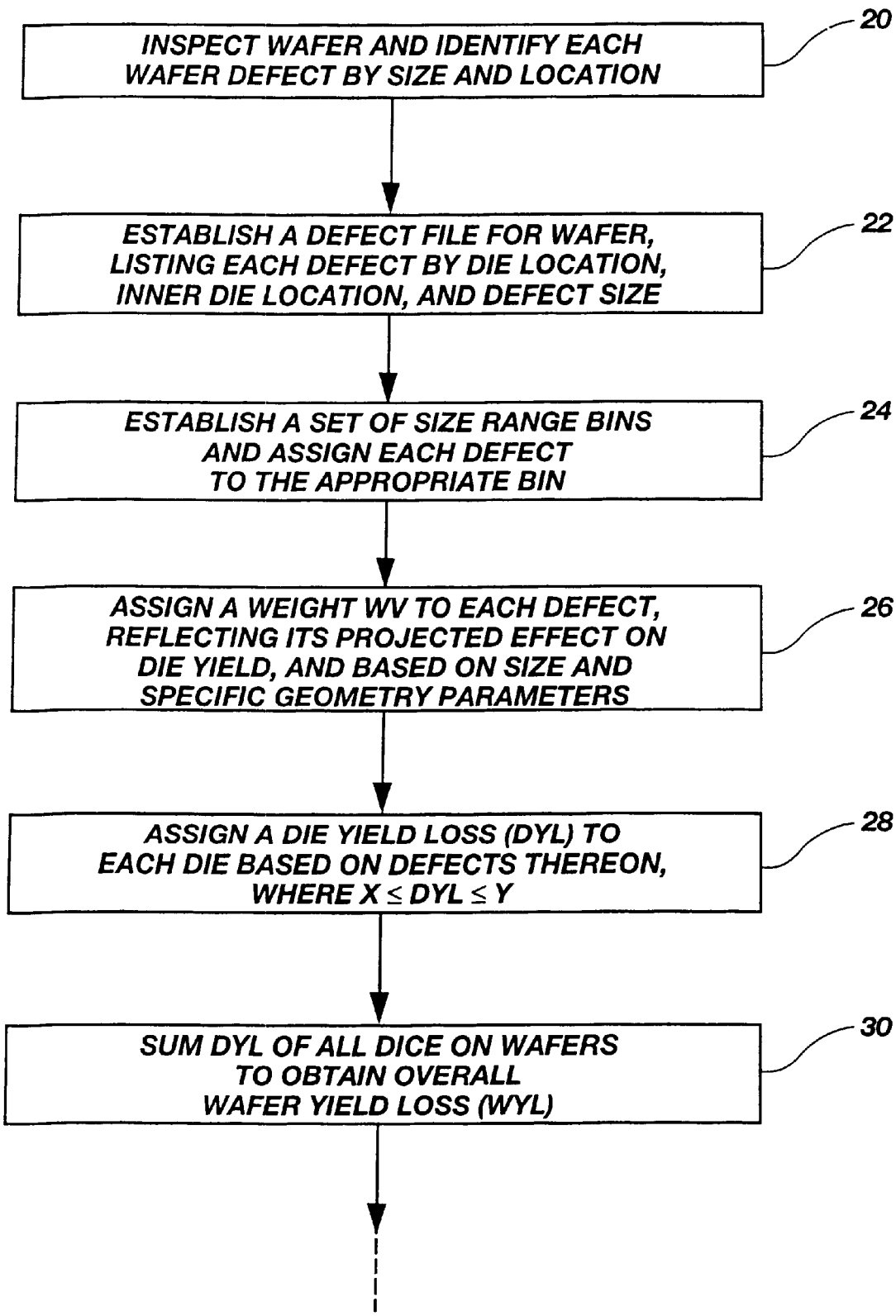
FIG. 2A is a flow diagram illustrating initial steps of a method of the instant invention in an IC manufacturing process.
Figure 2B:
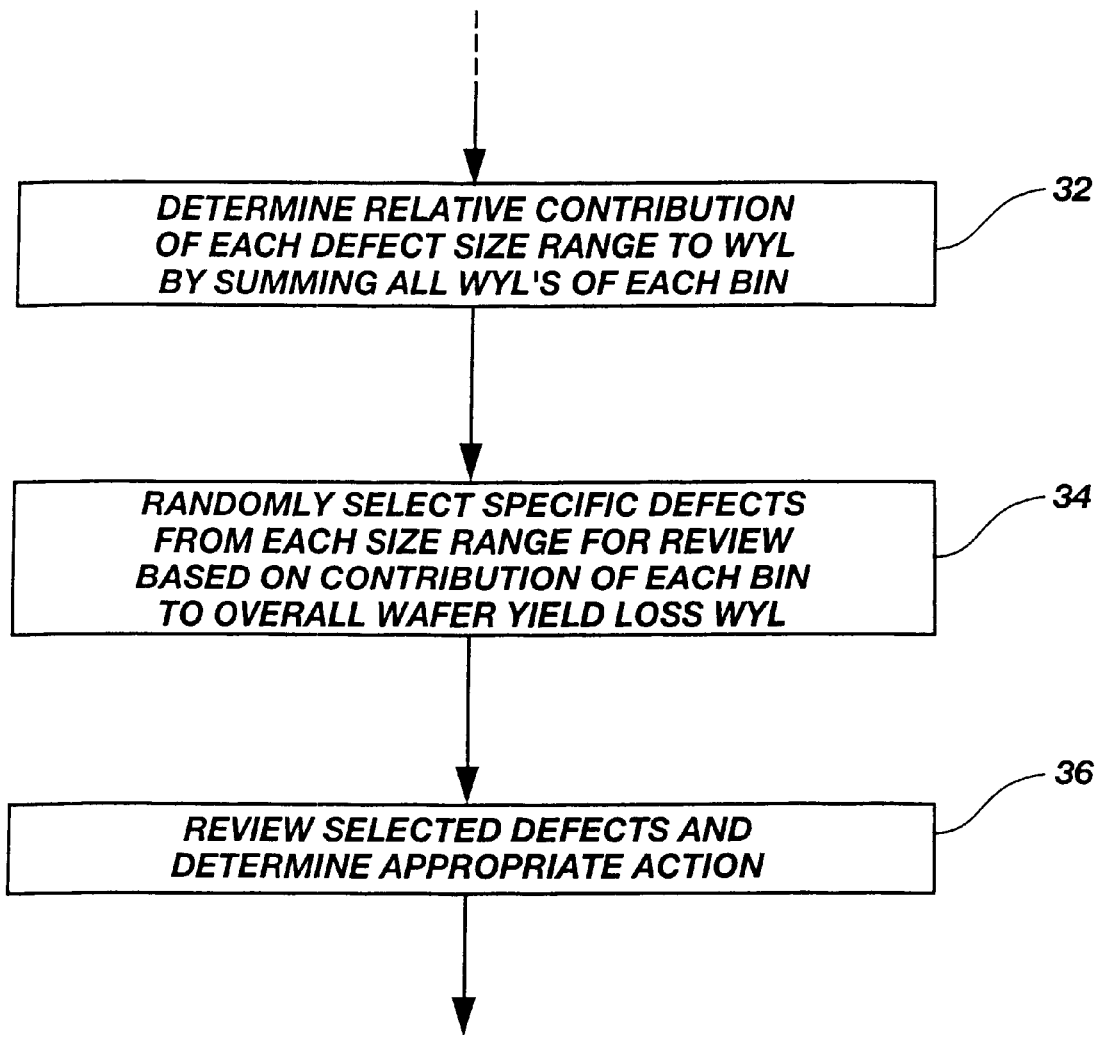
FIG. 2B is a flow diagram illustrating latter steps of a method of the instant invention in an IC manufacturing process, and is a continuation of FIG. 2A.

The steps comprising the method of the instant invention are illustrated in drawing FIGS. 2A and 2B. In Step 20, a wafer inspection tool such as those known in the art inspects a wafer 12. For each wafer 12, a defect file is generated in Step 22, identifying each defect 14 and characterizing it by the die or dice 16 it affects (die location), the defect's location on each die it affects (inner die location), and defect size. A wafer map 10 indicating the location of each detected defect 14 may also be prepared by the inspection tool, as shown in FIG. 1. The wafer map 10 represents the wafer 12 and has coordinates showing scribe lines 18 separating the individual dice 16.

The sampling method of the instant invention is encased in a program which reads the defect file generated in step 20 and automatically conducts computations in intermediate steps 22 through 34 to produce a sample of defects 14 for review, classification and decision in step 36. The defects 14 automatically chosen for sampling are determined by the algorithm to be those representative of defects most likely to cause wafer yield losses WYL. Thus, the limited resources available for testing are used more effectively to evaluate defects 14 projected to have the greatest effect on yield. The projected effects of the most critical defects may then be addressed in-line in step 36, wherein appropriate measures may be taken to reduce wafer yield losses WYL. Various possible courses of action include:

(a) accepting the wafer 12 for further processing;

(b) rejecting the wafer entirely;

(c) reworking the wafer to remove defects;

(d) identifying dice predicted to fail, and avoiding expenditure of resources on such dice, to the extent possible;

(e) applying further tests to the subject wafer and/or other wafers of the same lot;

(f) accepting, or rejecting related wafers.

In Step 24 of the method of the invention, the defects 14 are stratified by size into a plurality of size ranges or "size bins". The number n of size range bins may be as low as three or four, or as high as desired. Generally, the use of more than six or seven size range bins does not significantly enhance the method. In a typical program of the method, six bins are used to classify defects 14 in the following size ranges:

Bin 1: 0.0 to 0.5 square $\mu$m

Bin 2: 0.5 to 1.0 square $\mu$m

Bin 3: 1.0 to 2.0 square $\mu$m

Bin 4: 2.0 to 4.0 square $\mu$m

Bin 5: 4.0 to 8.0 square $\mu$m

Bin 6: >8.0 square $\mu$m

The total number T of defects 14 in each of the n size range bins is counted to obtain values for $T_0$ through $T_n$.

In accordance with Step 26, each defect 14 detected by the surface inspection tool is then assigned a defect weight value WV which reflects its projected effect on wafer yield. The defect weight value WV is based on defect size and part type specific geometry parameters, as known from historical records and/or projected therefrom. The algorithm of the invention may be set up to associate a particular defect weight value WV based on (a) defect size and (b) location of the defect 14 on an IC die 16. The greater the value of the defect weight, the greater the projected impact on yield.

For each inspected IC die 16 of the wafer 12, the defect weight values of the applicable defect(s) 14 are used to produce, in Step 28, a die yield loss metric DYL. This DYL has values between X and Y, where X and Y may be 0.0 and 1.0, for example. A DYL value of 0.0 represents a prediction of no yield loss, and a value of 1.0 represents a prediction of a fatal yield loss from the defect(s), i.e. no yield. Thus, the higher the DYL value, the greater the predicted effect of the defect(s) on the IC die.

For purposes of the program, other numerical values may be assigned to X and Y. Preferably, the values for X and Y correspond to the lower and upper limits for defect weight DW. Values of 0.0 and 1.0 simplify the calculations, however, and will be used throughout this discussion.

The cumulative effect of all weighted defects on an individual die i is calculated to produce a die yield loss value $DYL_i$ for that die. A DYL value for each IC die on the wafer 12 is calculated.

The calculated predicted die yield losses DYL's for all dies 16 on the wafer 12 are then summed in Step 30 to obtain a value for wafer level yield loss WYL.

$$WYL = \Sigma DYL_i$$

The effect of the defects 14 in each defect size "bin" is determined by stripping off the values of each of the defects in a bin, and re-computing the wafer level yield loss value WYL. This is shown in Step 32 of drawing FIG. 2B. A large reduction in the wafer level yield loss WYL (or die level yield loss DYL) indicates that defects 14 in the stripped bin have a large effect upon the particular yield loss. Conversely, a small reduction in WYL indicates that defects 14 in the stripped bin have little effect upon the yield loss. The program quantifies the yield loss assigned to each die 16 and to the total wafer 12, where each size "bin" is excluded, in turn, from the calculations.

$DYL_{i,1}$ = yield loss metric assigned to die i with Bin 1 defects excluded.

Values of an intermediate parameter D are calculated for each bin, indicating the relative drops, i.e. reductions in wafer yield loss when defects of each size "bin" are, in turn, excluded. For example, for bin 1, $$D_1 = \frac{WYL - WYL_1}{WYL} = 1 - \frac{WYL_1}{WYL}$$

where $0.0 \leq D_1 \leq 1.0$.

The larger the value of D, the greater the influence the particular excluded "size bin" has on the wafer level yield loss WYL.

As indicated in Step 34, particular defects are then randomly selected from the defect bins and outputted to a file for review. Logic may be included for limiting the number of defects sampled from the same die.

The defect selection is preferably based on the proportion of the total wafer level yield loss WYL attributable to the particular size bin. Thus, the proportion $P_1$ of WYL attributable to the first bin (bin number 1) is:

$$P_1 = \frac{D_1}{\sum_{i=1}^{n} D_i}$$

where $0.0 \leq P \leq 1.0$ and
where $P_T$ = the total of all P's=1.0.

A decision is made regarding the total number of defects $S_T$ to sample for review and evaluation. This decision is based on the time and resources available for such evaluation. The number of samples from each size bin is set to be proportional to the WYL attributable to the bin:

$$S_1 = P_1 \times S_T$$

$$S_2 = P_2 \times S_T$$

etc.

The determined numbers S of defect samples may be randomly selected from each size range bin and outputted to a file for engineering review. Currently known random sampling programs for a single population may be applied to the defect population of each individual size range bin.

In summary, the method collects a sample of defects 14 which are predicted to have the greatest impact on wafer yield, based on defect size, defect spatial characteristics and a yield metric. Thus, as shown in Step 36, defects 14 which reduce the wafer yield to the greatest extent may be identified and addressed in-line to limit their effect on yield.

EXAMPLE

In an example of an algorithm of the invention applied to a semiconductor wafer having the defect map of FIG. 1, six "size bins" are selected to cover the following defect size ranges:

Bin 1: 0.0 to 0.5 square $\mu$m
Bin 2: 0.5 to 1.0 square $\mu$m
Bin 3: 1.0 to 2.0 square $\mu$m
Bin 4: 2.0 to 4.0 square $\mu$m
Bin 5: 4.0 to 8.0 square $\mu$m
Bin 6: >8.0 square $\mu$m Wafer defect data generated by an inspection tool are treated by an algorithm to assign defects to size range bins. Calculations are performed as previously described to provide, for each size range bin:

a. the percentage of defects in each bin,
b. the WYL attributable to each bin,
c. the relative yield drop D for each bin,
d. the proportion of D attributable to each bin, and
e. the calculated number of samples from each size range bin (rounded off to whole numbers).

Exemplary data may be printed out from the computer generated file as illustrated in drawing FIG. 3.

The computer program then selects the indicated number of samples from each size range bin in a statistically random manner. In this example, the 12 selected defects may be more thoroughly examined, by microscope for example, or by other means and methods which are appropriate, for determining proper action to take. A log sheet useful in compiling a final test report for the wafer is indicated in drawing FIG. 4, and has spaces for recording the results of manual microscopic examination by an electron microscope or optical microscope.

As a result of using this method, manufacturing and test resources may be judiciously used in Step 36 to evaluate defects having the greatest effect upon yield loss. The focus of process evaluation may be quickly drawn to defects having the greatest effect on yield, reducing waste in manufacturing and testing costs.

While the method of this invention may be performed manually, it is advantageously digitally performed on a computer for ease and speed. A computer program to accomplish the method may take any of a variety of forms, all of which produce the same results, i.e. a sampling of defects having the greatest effect on wafer yield. The calculations outlined herein represent a rapid, accurate and easily conducted program for obtaining the desired results.

It is apparent to those skilled in the art that various changes and modifications, including variations in step order, etc. may be made to the sampling method and program of the invention as described herein without departing from the spirit and scope of the invention as defined in the following claims.

What is claimed is:

1. A processing method for semiconductor dice on a wafer comprising:

inspecting said semiconductor dice on said wafer for determining defects thereon and classifying each of said defects by size and location, said inspecting and said classifying comprising said classifying said each of said defects into one of a plurality of size range populations of defects;

assigning a weight to said each of said defects representing an estimated effect of said each of said defects on die yield for said semiconductor dice;

determining an estimated die yield loss (DYL) for each die of said semiconductor dice based on number and weight of said defects on said each die of said semiconductor dice, determining said estimated die yield loss (DYL) including calculating an estimated die yield loss having lower and upper limits;

summing all said estimated DYL of said semiconductor dice on said wafer to obtain a wafer yield loss (WYL);

subdividing the defects into said plurality of size range populations of defects of said semiconductor dice; and determining a relative contribution of each size range population of defects of said plurality of size range populations of said semiconductor dice to said WYL.

2. The processing method of claim 1, wherein said determining said estimated die yield loss (DYL) comprises calculating an estimated die yield loss having lower and upper limits of zero and 1.0, respectively.

3. The processing method of claim 2, wherein said lower limit comprises a representation of no yield loss attributable to said defects and said upper limit comprises a representation of fatal yield loss attributable to said defects.

4. The processing method of claim 1, wherein said determining said estimated die yield loss (DYL) comprises calculating an estimated die yield loss having a lower limit and an upper limit of zero and 1.0, respectively.

5. The processing method of claim 1, wherein said subdividing said defects into said plurality of size range populations of defects comprises subdividing said defects into a range of 0 to 10 size range populations.

6. A processing method for semiconductor dice on a wafer comprising:

inspecting said semiconductor dice on said wafer to determine defects thereon and classifying each of said defects by size and location, said inspecting and said classifying comprising classifying said each of said defects into one of a plurality of size range populations of defects;

assigning a weight to said each of said defects representing an estimated effect of said defects on die yield for said semiconductor dice;

determining an estimated die yield loss (DYL) for each die of said semiconductor dice based on number and weight of said defects on said each die of said semiconductor dice;

summing all DYL of said semiconductor dice on said wafer to obtain a wafer yield loss (WYL);

subdividing the defects into said plurality of size range populations of defects; and determining a relative contribution of each size range population of defects of said plurality of size range populations to said WYL, said determining the relative contribution of said each size range population of defects of said plurality of size range populations to said wafer yield loss comprises:

discarding data for said each size range population of defects of said plurality of size range populations calculating, in turn, a drop in said WYL for combined size range populations excluding the discarded data;

summing the calculated wafer yield losses to obtain a drop sum;

dividing said drop sum to determine a relative drop attributable to said each size range population of defects of said plurality of size range populations; and randomly selecting defects from said each size range population of defects.

7. The processing method of claim 1, further comprising:

randomly selecting defects from said each size range population of defects of said plurality of size range populations, a number selected from said each size range population of defects of said plurality of size range populations in proportion to said relative contribution thereof, said randomly selected defects being weighted to represent defects having greatest effect on the wafer yield losses.

8. The processing method of claim 7, further comprising:

reviewing said randomly selected defects and determining in-line action required to reduce wafer yield losses.

9. The processing method of claim 8, wherein said reviewing said randomly selected defects includes visual inspection by one of a scanning microscope and an optical microscope.

10. The processing method of claim 8, wherein said determining in-line action comprises determining if an individual die of said semiconductor dice on said wafer is acceptable to proceed in a manufacturing process.

11. The processing method of claim 1, wherein said inspecting said semiconductor dice is performed by an automated surface inspection tool.

12. A processing method for semiconductor dice on a wafer comprising:

inspecting said wafer to determine defects thereon and classifying each of said defects by size and location;

assigning a weight to said each of said defects representing an estimated effect of said each of said defects on die yield;

determining an estimated die yield loss (DYL) for each die based on number and weight of said defect(s) on said each said die of said semiconductor dice;

summing all DYL of said semiconductor dice on said wafer to obtain a wafer yield loss (WYL);

subdividing the defects into a plurality of size range populations of defects;

determining a relative contribution of each size range population of defects of said plurality of size range populations to said wafer yield loss WYL;

randomly selecting defects from said each size range population of defects of the plurality of size range populations, a number selected from said each size range population of defects of the plurality of size range populations in proportion to said relative contribution thereof, said randomly selected defects weighted to represent defects having greatest effect on yield losses;

reviewing said randomly selected defects.

13. The processing method of claim 12, further comprising:

reviewing said randomly selected defects and determining in-line action required to reduce said wafer yield losses.

14. The processing method of claim 12, wherein said inspecting said wafer said dice and said classifying each of said defects comprises classifying each of said defects into one of said plurality of size range populations of defects.

15. The processing method of claim 12, wherein said determining said estimated die yield loss (DYL) comprises calculating an estimated die yield loss having lower and upper limits of zero and 1.0, respectively.

16. The processing method of claim 15, wherein said lower limit comprises a representation of no yield loss attributable to said defects and said upper limit comprises a representation of fatal yield loss attributable to said defects.

17. The processing method of claim 12, wherein said subdividing said defects into said plurality of size range populations of defects comprises subdividing said defects into a range of 0 to 10 size range populations.

18. The processing method of claim 12, wherein said determining the relative contribution of said each size range population of defects of said plurality of size range populations to said wafer yield loss comprises:

discarding data for said each size range population of defects of said plurality of size range populations and calculating, in turn, a drop in said wafer yield loss for combined size range populations excluding the discarded data;

summing the calculated drop in wafer yield losses to obtain a drop sum; and dividing said drop sum to determine a relative drop attributable to said each size range population of defects of said plurality of size range populations.

19. The processing method of claim 13, wherein said reviewing said randomly selected defects includes visual inspection by one of a scanning microscope and an optical microscope.

20. The processing method of claim 13, wherein said determining in-line action required to reduce said wafer yield losses comprises determining if an individual die of said semiconductor dice on said wafer is acceptable to proceed in a manufacturing process.

21. The processing method of claim 12, wherein said inspecting wafer is performed by an automated surface inspection tool.

22. A processing method for semiconductor dice on a wafer comprising:

inspecting said semiconductor dice on said wafer to determine defects thereon and classifying each of said defects by size and location, said inspecting and classifying comprising classifying said each of said defects into one of a plurality of size range populations of defects;

assigning a weight to said each of said defects representing an estimated effect of said each of said defects on die yield;

determining an estimated die yield loss (DYL) for each semiconductor die based on number and weight of said defects on said each semiconductor die of said semiconductor dice, said determining said estimated die yield loss including calculating an estimated die yield loss having lower and upper limits;

summing all DYL of said semiconductor dice on said wafer to obtain a wafer yield loss (WYL);

subdividing the defects into said plurality of size range populations of defects;

determining a relative contribution of each size range population of defects of said plurality of size range populations to said WYL;

randomly selecting defects from said each size range population of defects of the plurality, a number selected from said each size range population of defects of the plurality in proportion to said relative contribution thereof, said randomly selected defects weighted to represent defects having greatest effect on yield losses; and reviewing said randomly selected defects and determining in-line action required to reduce said wafer yield losses.

23. The processing method of claim 22, wherein said determining said estimated die yield loss comprises calculating an estimated die yield loss having lower and upper limits of zero and 1.0, respectively.

24. The processing method of claim 23, wherein said lower limit comprises a representation of no yield loss attributable to said defects and said upper limit comprises a representation of fatal yield loss attributable to said defects.

25. The processing method of claim 22, wherein said subdividing said defects into said plurality of size range populations of defects comprises subdividing said defects into a range of 0 to 10 size range populations.

26. The processing method of claim 22, wherein said determining the relative contribution of said each size range population of defects of said plurality of size range populations to said wafer yield loss comprises:

discarding data for said each size range population of defects of said plurality of size range populations; and calculating, in turn, a drop in wafer yield loss for combined size range populations excluding the discarded data;

summing the calculated drop in wafer yield losses to obtain a drop sum; and dividing said drop sum to determine a relative drop sum attributable to said each size range population of defects of said plurality of size range populations.

27. The processing method of claim 22, wherein said reviewing said randomly selected defects includes visual inspection by one of a scanning microscope and an optical microscope.

28. The processing method of claim 22, wherein said determining in-line action comprises determining if an individual die of said semiconductor dice on said wafer is acceptable to proceed in a manufacturing process.

29. The processing method of claim 22, wherein said inspecting said semiconductor dice is performed by an automated surface inspection tool.

* * * * *